United States Patent
Takatsuki et al.

(10) Patent No.: US 8,394,231 B2
(45) Date of Patent: Mar. 12, 2013

(54) PLASMA PROCESS DEVICE AND PLASMA PROCESS METHOD

(75) Inventors: Koichi Takatsuki, Nirasaki (JP); Hikaru Yoshitaka, Tsukui-gun (JP); Shigeo Ashigaki, Tsukui-gun (JP); Yoichi Inoue, Minato-ku (JP); Takashi Akahori, Tsukui-gun (JP); Shuuichi Ishizuka, Nirasaki (JP); Syoichi Abe, Tsukui-gun (JP); Takashi Suzuki, Nirasaki (JP); Kohei Kawamura, Nirasaki (JP); Hidenori Miyoshi, Nirasaki (JP); Gishi Chung, Nirasaki (JP); Yasuhiro Oshima, Nirasaki (JP); Hiroyuki Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 446 days.

(21) Appl. No.: 11/656,379

(22) Filed: Jan. 23, 2007

(65) Prior Publication Data

US 2007/0131171 A1 Jun. 14, 2007

Related U.S. Application Data

(62) Division of application No. 10/466,873, filed on Jan. 29, 2004, now abandoned.

(30) Foreign Application Priority Data

Jan. 22, 2001 (JP) .................................. 2001-13572
Jan. 22, 2001 (JP) .................................. 2001-13574
Aug. 7, 2001 (JP) ................................ 2001-239720

(51) Int. Cl.
*C23F 1/00* (2006.01)
*H01L 21/306* (2006.01)
*C23C 16/00* (2006.01)
*H05H 1/24* (2006.01)
*H01J 7/24* (2006.01)

(52) U.S. Cl. .......... 156/345.47; 156/345.34; 118/723 E; 216/67; 427/569; 315/111.21; 438/710

(58) Field of Classification Search ............. 156/345.33, 156/345.34; 118/715
See application file for complete search history.

(56) References Cited

U.S. PATENT DOCUMENTS 5,449,410 A * 9/1995 Chang et al. ............ 118/723 ER
5,624,499 A   4/1997 Mizuno et al.
5,755,886 A * 5/1998 Wang et al. ................... 118/715

(Continued)

FOREIGN PATENT DOCUMENTS

JP    08302473 A    11/1996
JP    09134910 A    5/1997

(Continued)

OTHER PUBLICATIONS

Japanese Office Action dated Jul. 25, 2006 (four (4) pages) with an English translation.

*Primary Examiner* — Maureen Gramaglia
(74) *Attorney, Agent, or Firm* — Crowell & Moring LLP

(57) ABSTRACT

That surface of an electrode plate 20 which is opposite to a susceptor 10 has a projection shape. The electrode plate 20 is fitted in an opening 26a of shield ring 26 at a projection 20a. At this time, the thickness of the projection 20a is approximately the same as the thickness of the shield ring 26. Accordingly, the electrode plate 20 and the shield ring 26 form substantially the same plane. The major surface of the projection 20a has a diameter 1.2 to 1.5 times the diameter of a wafer W. The electrode plate 20 is formed of, for example, SiC.

18 Claims, 12 Drawing Sheets

U.S. PATENT DOCUMENTS 5,959,409 A * 9/1999 Dornfest et al. ......... 315/111.21
6,059,885 A * 5/2000 Ohashi et al. ................ 118/730

FOREIGN PATENT DOCUMENTS

| | | | |
|---|---|---|---|
| JP | 10050663 A | 2/1998 |
| JP | 11043781 A | 2/1999 |
| JP | 11251093 A | 9/1999 |
| JP | 11293468 A | 10/1999 |
| JP | 11350118 A | 12/1999 |
| JP | 2000200782 A | 7/2000 |
| JP | 2000260721 A | 9/2000 |
| WO | WO-9965057 A1 | 12/1999 |

* cited by examiner

PLASMA PROCESS DEVICE AND PLASMA PROCESS METHOD

TECHNICAL FIELD

The present invention relates to a plasma process system and a plasma process method which perform processes, such as film deposition and etching, using a plasma.

BACKGROUND ART

A plasma process system which processes the surface of a substrate, such as a semiconductor wafer, using a plasma is used in a fabrication process for a liquid crystal display or the like. As plasma process systems, there are, for example, a plasma etching system which performs etching on a substrate and a plasma CVD system which performs chemical vapor deposition (Chemical Vapor Deposition: CVD). Of them, a parallel plate plasma process system is widely used because it has an excellent process uniformity and its system structure is relatively simple.

The structure of a parallel plate plasma process system is shown in FIG. 17. As shown in FIG. 17, a plasma process system 101 comprises a chamber 102, a shower electrode 103 which feeds a process gas into the chamber 102 and constitutes an upper electrode, and a susceptor 104 on which a subject W to be processed, such as a semiconductor wafer, is placed and which constitutes a lower electrode.

The shower electrode 103 comprises an electrode plate 106 having multiple gas holes 105, and an electrode support 108 having a hollow portion 107 which leads the process gas to the gas holes 105. The electrode plate 106 is supported on the electrode support 108 at its peripheral portion by screws or the like and the supported portion is covered with a shield ring 109 made of an insulator. The shield ring 109 has an opening having a smaller diameter than the electrode plate 106 and is constructed in such a way that the electrode plate 106 is exposed to the inside of the opening. The shield ring 109 reduces the generation of abnormal discharge at the supported portion.

The plasma process system 101 feeds a process gas (the solid-line arrows in the diagram) to the to-be-processed subject W through the gas holes 105 of the electrode plate 106 and supplies RF power to the electrode plate 106 to form an RF electric field (the broken-line arrows in the diagram) between the exposed surface of the electrode plate 106 and the susceptor 104. This generates the plasma of the process gas on the to-be-processed subject W and performs a predetermined process on the surface of the to-be-processed subject W.

The plasma process system 101 with the above-described structure has the following problems (1) and (2).

(1) To secure insulation, the shield ring 109 which protects the periphery of the electrode plate 106 is made of a plate-like member having a thickness of, for example, about 10 mm. The electrode plate 106 is placed over the shield ring 109 in such a way as to be exposed to the inside of the opening of the shield ring 109. At this time, a step Δ is formed between the peripheral portion of the exposed surface (bottom surface) of the electrode plate 106 and the surface which is near the opening of the shield ring 109.

Such a step Δ varies the process characteristic of the whole surface of the to-be-processed subject W and reduces the process uniformity. That is, the gas in the opening that is supplied through the gas holes 105 stays at the step Δ, disturbing the flow of the gas. This makes the gas supply at the center portion and end portion of the to-be-processed subject W uneven, thus lowering the process uniformity.

The diameter of the exposed surface of the electrode plate 106 (hereinafter referred to as "upper electrode diameter") that contacts a plasma is so formed as to be nearly equal to the diameter of the surface of the opposing to-be-processed subject W. That is, the upper electrode diameter is not determined to optimize a gas flow and an electric field, which are formed between the electrode plate 106 and the to-be-processed subject W, and to carry out a process with high uniformity. Therefore, a process with a sufficiently high uniformity may not be executed.

Even in case where the gas blowoff diameter and the upper electrode diameter are changed in order to optimize the gas flow and electric field, the gas blowoff diameter and the upper electrode diameter are substantially determined by the diameter of the opening of the shield ring 109. It is therefore difficult to optimize the gas blowoff diameter and the upper electrode diameter by independently varying them to thereby improve the process uniformity.

As apparent from the above, the conventional plasma process system 101 did not have the gas blowoff diameter and the upper electrode diameter optimized to ensure sufficiently high process uniformity.

(2) Dry cleaning using a halogen-based gas, such as fluorine-based gas, is performed in the plasma process system 101. Specifically, a halogen-based gas is generated inside or outside the chamber 102 and a film adhered or deposited to the inside of the chamber 102 is removed by a halogen active seed (e.g., fluorine radicals) in the gas plasma Particularly, fluorine has a high reactivity to silicon and is suitable to clean a process system which processes silicon-based films.

Here, to avoid metal contamination, the electrode plate 106 is formed of silicon. Such a silicon-based electrode plate 106 is likely to be etched by the cleaning. Particularly, in remote plasma cleaning which generates the plasma of the cleaning gas outside the chamber 102 and selectively supply a radical seed in the chamber 102, the radical seed is highly active so that the degradation (etching) of the electrode plate 106 becomes noticeable.

The degradation of the electrode plate 106 means a change in the shape of the electrode plate 106 and changes the RF electric field. A change in electric field varies the process characteristics at, for example, the center portion and end portion of the to-be-processed subject W, thus lowering the process uniformity.

In case where the electrode plate 106 formed of silicon is used, as mentioned above, cleaning is likely to etch the electrode plate 106 so that a process with sufficiently high uniformity may not be carried out.

DISCLOSURE OF THE INVENTION

It is therefore an object of the invention to provide a plasma process system and a plasma process method which can perform a process with high uniformity on a subject to be processed.

To achieve the object, a plasma process system (1) according to the first aspect of the invention comprises:

a chamber (2);

an electrode plate (20) provided with gas holes (19) for supplying a process gas into the chamber (2) and having a projection (20a); and a shield ring (26) having an opening (26a) which is fitted over the projection (20a) and is constituted by a ring-like plate member which covers a peripheral portion of the electrode plate (20) with the projection (20a) and the opening (26a) fitted together.

In the system with the above-described structure, for example, the projection (20a) of the electrode plate (20), in such a state as to be fitted in the opening (26a), forms a substantially flat surface together with a major surface of the shield ring (26).

To achieve the object, a plasma process system (1) according to the second aspect of the invention comprises:

a first electrode plate (10) on one surface of which a subject to be processed is placed; and a second electrode plate (20) connected to a high-frequency power supply and having an opposing surface opposing the one surface in parallel and having a diameter 1.2 to 1.5 times a diameter of the one surface.

The system with the above-described structure may further comprise a shield ring (26) which has an opening (26a) formed therein with a diameter approximately equal to the diameter of the opposing surface and covers a peripheral portion of the second electrode plate (20) in such a way that the opposing surface is exposed to the inside of the opening (26a).

In the system with the above-described structure, the opposing surface may be a major surface and the second electrode plate (20) may have a projection (20a) which fits in the opening (26a)

To achieve the object, a plasma process system (1) according to the third aspect of the invention comprises:

a chamber (2);

an electrode plate (20) connected to a high-frequency power supply and provided with first gas holes (19) for supplying a process gas into the chamber (2); and a shield ring (26) which is provided with second gas holes (26b), has an opening (26a) and covers a periphery of the electrode plate (20) in such a way that the electrode plate (20) is exposed to the inside of the opening (26a).

In the system with the above-described structure, the second gas holes (26b) may be laid out annually around the opening (26a) and a maximum layout diameter of the second gas holes (26b) may be about 1.1 times a diameter of the opening (26a).

In the system with the above-described structure, the exposed surface may be a major surface, the electrode plate (20) may have a projection (20a) which fits in the opening (26a), and a major surface of the projection (20a) may form a substantially flat surface together with the shield ring (26).

To achieve the object, a plasma process system (1) according to the fourth aspect of the invention comprises:

a chamber (2) in which a predetermined plasma process is performed on a subject to be processed;

a cleaning gas supply port (30) which supplies a cleaning gas containing halogen into the chamber (2); and an electrode plate (20) provided with gas holes (19) for supplying a process gas into the chamber (2) and so constituted as to contain a material resistive to a halogen radical.

In the system with the above-described structure the electrode plate (20) is so constituted as to contain a material resistive to a halogen radical rather than to silicon, for example.

In the system with the above-described structure, the cleaning gas is comprised of a material containing, for example, fluorine and the halogen radical is comprised of, for example, a fluorine radical.

In the system with the above-described structure, the material resistive to the halogen radical may be selected from a group of silicon carbide, carbon, aluminum, alumite, alumina and sprayed quartz alumina The plasma process system (1) with the above-described structure may further comprise:

a mount table (10) which is provided opposite to the electrode plate (20) and on which the subject to be processed is placed; and a ring-like member (17) formed of a material resistive to the halogen radical.

In the system with the above-described structure, for example, the cleaning gas is turned into a plasma in the chamber (2) to generate the halogen radical.

The plasma process system (1) with the above-described structure may further comprise an activator (33) provided outside the chamber (2) and connected to the cleaning gas supply port, and the activator (33) may generate the halogen radical by activating the cleaning gas and supply the generated halogen radical into the chamber (2) 2.

In the system with the above-described structure, for example, the cleaning gas is so formed as to contain an oxygen-containing material.

To achieve the object, a plasma process method according to the fifth aspect of the invention uses a plasma process system having a chamber (2) in which a predetermined plasma process is performed on a subject to be processed by generation of a plasma inside, a first electrode plate (10) on one surface of which a subject to be processed is placed, and a second electrode plate (20) connected to a high-frequency power supply and having an opposing surface opposing the one surface in parallel, and includes the step of:

setting a diameter of the opposing surface to 1.2 to 1.5 times a diameter of the one surface and supplying high-frequency power to the second electrode is included.

To achieve the objects, a plasma process method according to the second aspect of the invention uses a plasma process system having a chamber (2) in which a predetermined plasma process is performed on a subject to be processed by generation of a plasma inside, an electrode plate (20) provided with first gas holes (19) for supplying a process gas into the chamber (2) and connected to a high-frequency power supply, and a shield ring (26) which is provided with second gas holes (26b), has an opening (26a) and covers a periphery of the electrode plate (20) in such a way that the electrode plate (20) is exposed to the inside of the opening (26a), and includes the step of:

spraying the gas into the chamber (2) through the first gas holes (19) and the second gas holes (26b).

BEST MODE FOR CARRYING OUT THE INVENTION (First Embodiment)

A process system according to the first embodiment of the invention will now be described below with reference to the accompanying drawings. In the following embodiment to be illustrated below, a parallel plate plasma process system which forms a silicon fluoride oxide (SiOF) film on a semiconductor wafer (hereinafter "wafer W") by CVD (Chemical Vapor Deposition) will be described as an example.

Figure 1:
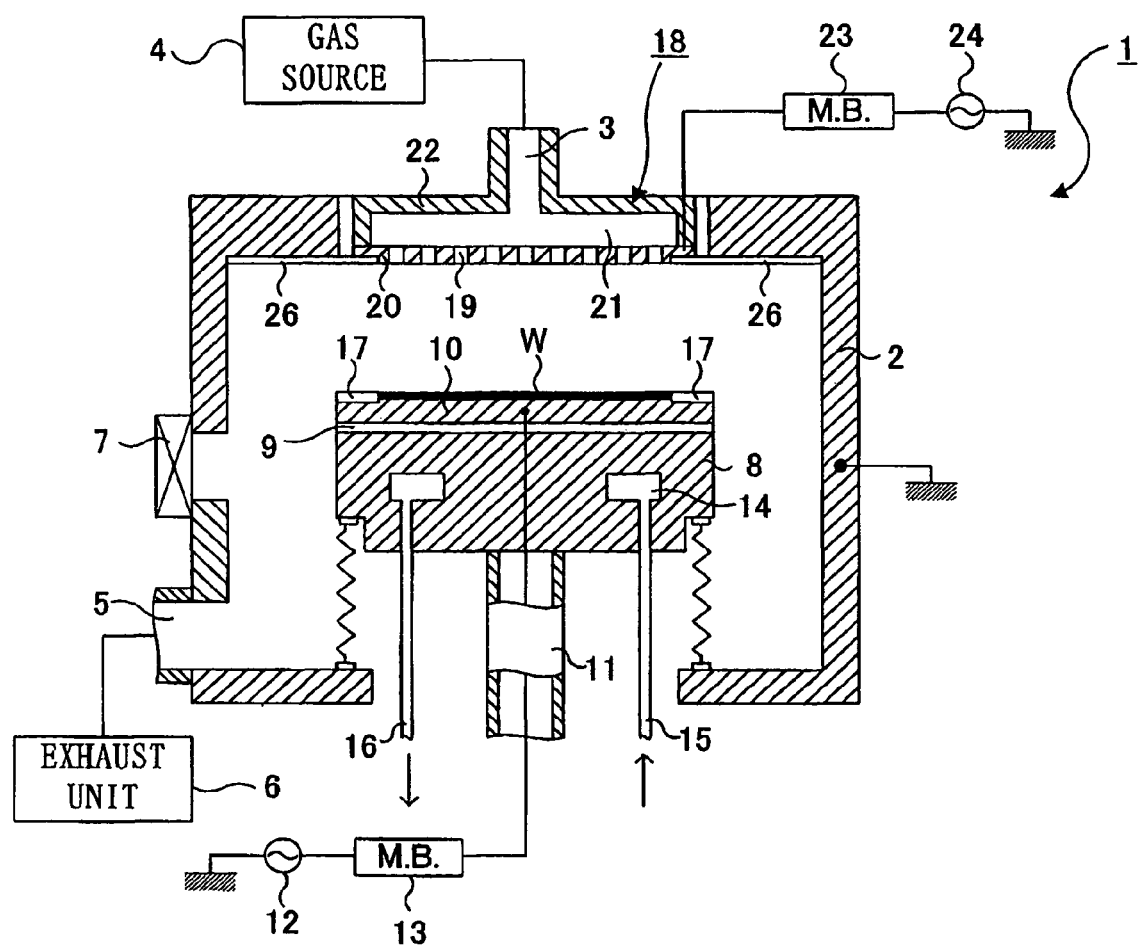
FIG. 1 illustrates the structure of a plasma process system according to a first embodiment.

FIG. 1 illustrates the structure of a plasma process system 1 according to the first embodiment.

The plasma process system 1 has a cylindrical chamber 2 made of, for example, aluminum whose surface has been subjected to an alumite process (anodic oxidation). The chamber 2 is grounded to a common potential.

A gas supply tube 3 is provided in the upper portion of the chamber 2. The gas supply tube 3 is connected to a which supplies a process gas having a mixture of $SiF_4$, $SiH_4$, $O_2$, Ar, etc. The process gas is adjusted to a predetermined flow rate by a mass flow controller (not shown) and is then supplied into the chamber 2.

An exhaust port 5 is provided in one side of the bottom portion of the chamber 2. An exhaust unit 6 which comprises a turbo molecular pump or the like is connected to the exhaust port 5. The exhaust unit 6 degases inside the chamber 2 to a predetermined depressurized atmosphere, e.g., a predetermined pressure of 1 Pa or lower.

A gate valve 7 is provided on a side wall of the chamber 2. With the gate valve 7 open, transfer-in and transfer-out of a wafer W is performed between the chamber 2 and an adjoining loadlock chamber (not shown).

A susceptor support 8 with an approximately columnar shape stands upright from the center of the bottom portion in the chamber 2. A susceptor 10 is provided on the susceptor support 8 via an insulator 9 of ceramics or the like. The susceptor support 8 is connected via a shaft 11 to an elevation mechanism (not shown) provided under the chamber 2 and is elevatable up and down.

An unillustrated electrostatic chuck which has approximately the same diameter as the wafer W is provided above the susceptor 10. The wafer W placed on the susceptor 10 is fixed by Coulomb's force by the electrostatic chuck The susceptor 10 is made of a conductor, such as aluminum, and constitutes the lower electrode of a parallel plate electrode. A first RF source 12 is connected to the susceptor 10 via a first matching device 13. The first RF source 12 has a frequency in a range of 0.1 to 13 MHz. As the frequency in the range is applied to the first RF source 12, an effect, such as imparting adequate ion impact to a to-be-processed subject, is acquired.

A refrigerant chamber 14 is provided inside the susceptor support 8. A refrigerant circulates in the refrigerant chamber 14. The refrigerant supplied trough a refrigerant supply tube 15 passes through the refrigerant chamber 14 and is discharged from a refrigerant discharge tube 16. As the refrigerant circulates in the refrigerant chamber 14, the susceptor 10 and the process surface of the wafer W are kept at a desired temperature. A transfer lift pin (not shown) for the wafer W is provided in an elevatable manner, penetrating the susceptor 10 and the electrostatic chuck.

A focus ring 17 made of an insulator, such as ceramics, is provided at the peripheral portion of the top surface of the susceptor 10. The focus ring 17 has an opening in the center and the diameter of the opening is made slightly larger than that of the wafer W. The wafer W is mounted on the top surface of the susceptor 10 which is exposed to the inside of the opening of the focus ring 17. The focus ring 17 allows a plasma active seed to be effectively incident to the wafer W.

An upper electrode 18 of the parallel plate electrode is provided at the roof portion of the chamber 2. The upper electrode 18 has a so-called shower head structure and comprises an electrode plate 20 having multiple gas holes 19 and an electrode support 22 which forms a hollow diffusion portion 21 between itself and the electrode plate 20.

The electrode support 22 is connected to the gas supply tube 3. The gas supplied from the gas supply tube 3 is diffused at the diffusion portion 21 and is sprayed through the multiple gas holes 19. The electrode plate 20 is provided in such a way as to face the susceptor 10 and is so formed as to have a diameter slightly larger than that of the wafer W. This causes the process gas to be supplied to the entire top surface of the wafer W.

The electrode plate 20, made of a conductive material, such as aluminum, is formed in a disk shape. The electrode plate 20 is connected to a second RF source 24 via a second matching device 23. Application of RF power to the electrode plate 20 generates the plasma of the gas supplied through the gas holes 19.

Figure 2:
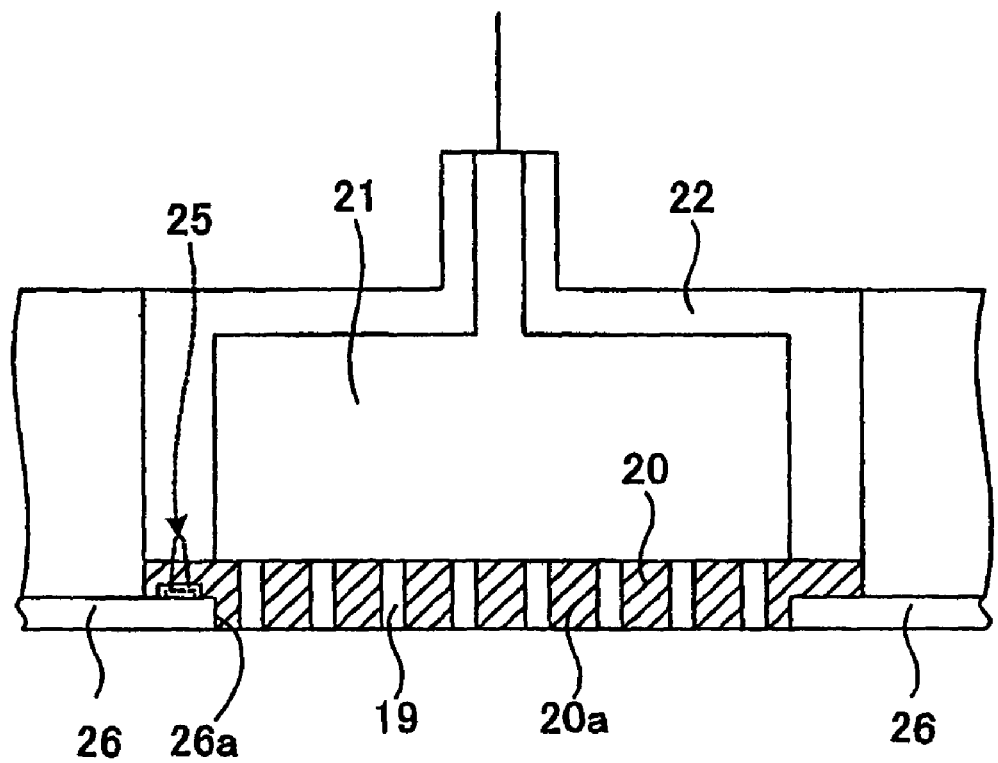
FIG. 2 shows the structure of an upper electrode shown in FIG. 1.

FIG. 2 shows an enlarged diagram of near the electrode plate 20. As shown in FIG. 2, the peripheral portion of the electrode plate 20 is formed thin so as to form a columnar projection 20a. The electrode plate 20 has screw grooves or the like in the peripheral portion and is fastened to the electrode support 22 at the peripheral portion by screws 25.

The screwed portions of the peripheral portion of the electrode plate 20 are covered with a shield ring 26 made of ceramics or the like, such as aluminum nitride. The shield ring 26 has a major surface in which an opening 26a is formed, and is fixed to the side portions or the like of the roof of the chamber 2 in such a way that the major surface becomes approximately parallel to the roof surface of the chamber 2. The opening 26a of the shield ring 26 is formed to have a smaller diameter than the electrode plate 20 and is provided so that the electrode plate 20 is exposed to the inside of the opening 26a. At least the major surface portion of the shield ring 26 is formed in a plate shape having a thickness of about 10 mm. Covering the screwed portions with the shield ring 26 prevents abnormal discharge or the like at the screwed portions at the time of generating a plasma.

The diameter of the opening 26a of the shield ring 26 is formed to be approximately equal to the diameter of the projection 20a of the electrode plate 20 and the shield ring 26 is placed in such a way that the projection 20a of the electrode plate 20 is fitted, downward, into the opening 26a.

The diameter of the projection 20a of the electrode plate 20 is set nearly equal to the diameter of the opening of the shield ring 26 and the projection 20a is constructed in such a way as to be fitted in the opening 26a of the shield ring 26 nearly without a gap. The gas holes 19 are formed so as to penetrate the projection 20a so that the spray of the process gas will not be inhibited by the shield ring 26.

The projection 20a of the electrode plate 20 and the shield ring 26, when fitted together, form substantially the same surface. That is, the height of the projection 20a of the electrode plate 20 is set to a value (e.g., about 10 mm) approximately equal to the thickness of the portion near the opening 26a of the shield ring 26.

In the above-described structure, the electrode plate 20 and the shield ring 26 form a flat surface with respect to a plasma generation area. In this case, a step is not formed between the exposed surface of the electrode plate 20 and the major surface of the shield ring 26. Accordingly, the flow of the process gas which is sprayed though the gas holes 19 is not disturbed at such a step portion and the flow of the process gas which is sprayed through the entire gas holes 19 becomes nearly uniform This allows the process gas to be supplied to the surface of the wafer W with high uniformity so that a process with high uniformity is performed on the wafer W.

EXAMPLE 1

Figure 3A:
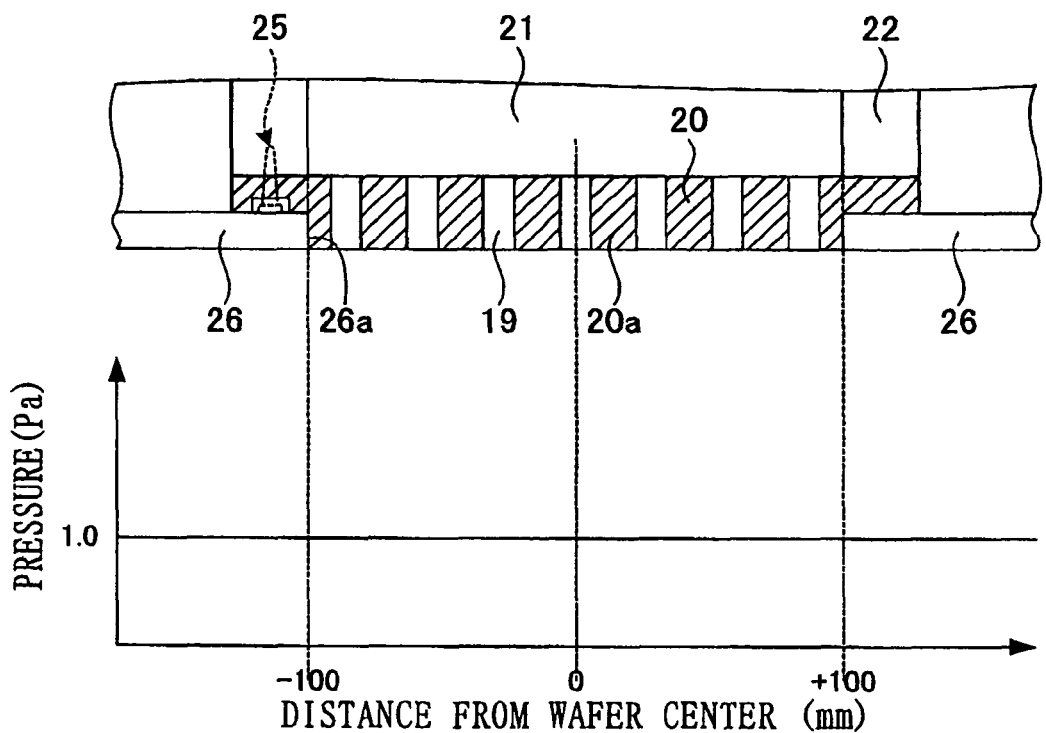
FIG. 3A shows the results of checking the pressure above a wafer when a projection type electrode plate is used.
Figure 3B:
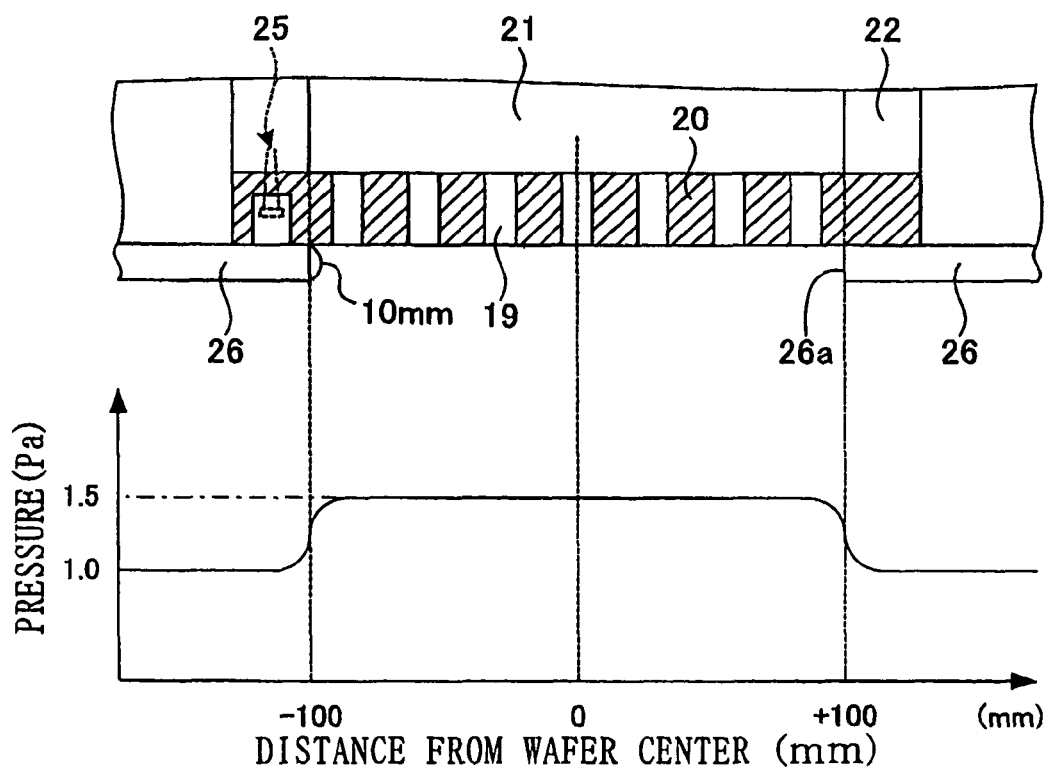
FIG. 3B shows the results of checking the pressure above a wafer when a flat electrode plate is used.

FIG. 3A shows the results of checking the pressure at individual points above the wafer W when an Ar gas is supplied into the chamber 2 via the projection type electrode plate 20. FIG. 3B shows the results when the flat electrode plate 20 which does not have the projection 20a is used. The distance between the electrode plate 20 and the susceptor 10 (gap between electrodes) was 30 mm and the Ar gas was let to flow to the surface of the wafer W of 200 mm at 300 sccm.

As shown in FIG. 3A, in the case of using the projection type electrode plate 20, the pressure above the wafer W does not change at the center portion and end portion and is nearly constant at about 1 Pa. In the case of using the flat type electrode plate 20, as shown in FIG. 2B, the pressure at the end portion above the wafer W is about 1 Pa whereas the pressure at the center portion becomes about 1.5 Pa nearly 50% higher. The pressure difference occurs near the step portion between the electrode plate 20 and the shield ring 26. It is understood from this the use of the projection type electrode plate 20 which does not produce a step can make the pressure above the wafer W nearly constant.

Figure 4:
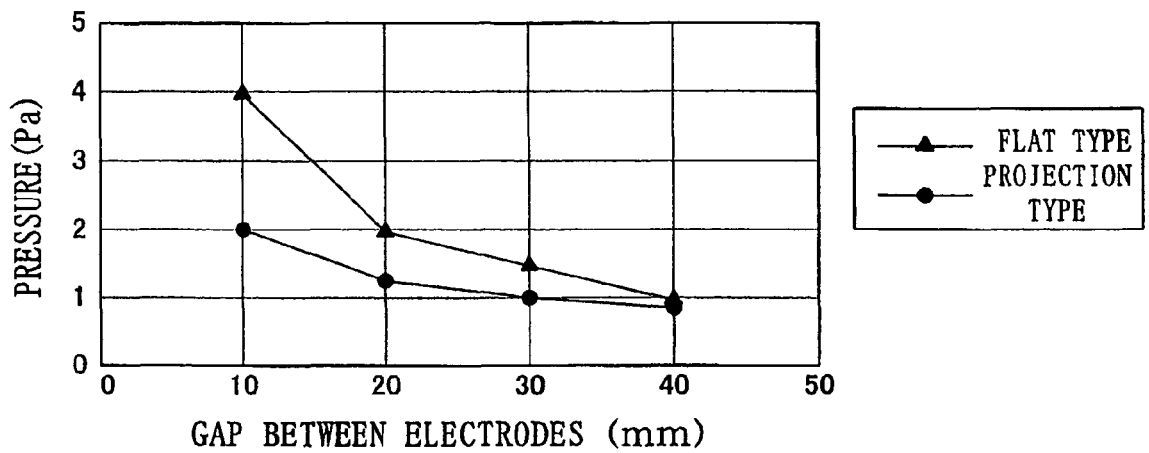
FIG. 4 shows the relationship between a gap between electrodes and pressure when projection type and flat electrode plates are used.

FIG. 4 shows the results of checking a change in pressure above the center of the wafer W when the gap between electrodes is changed in the experiments illustrated in FIG. 3A and 3B. When the flat electrode plate 20 is used, as shown in FIG. 4, the pressure greatly rises with a decrease in the gap between electrodes and reaches about 4 Pa at the electrode gap of 10 mm.

When the projection type electrode plate 20 is used, a significant rise in pressure is not seen even when the gap between electrodes is varied and the pressure is about 2 Pa, nearly half the pressure of the flat type, even at the electrode gap of 10 mm.

It is understood from the results shown in FIG. 4 that when the projection type electrode plate 20 is used, the pressure above the wafer W (ie., the substantial process pressure) becomes relatively low. In general, a high process pressure gives an undesirable influence to the plasma process. In a burying process by CVD, particularly, a high pressure is likely to produce voids. It is understood from this that the use of the projection type electrode plate 20 can ensure a highly reliable process, particularly, a burying process.

Figure 5:
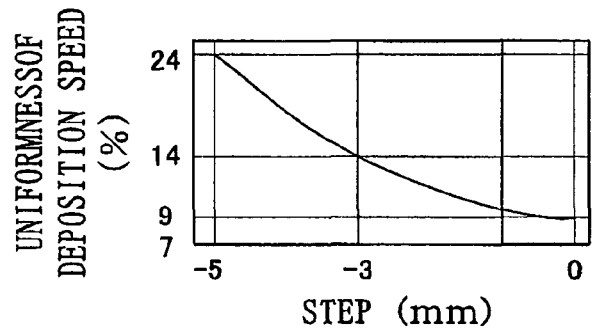
FIG. 5 shows the relationship between a step between the electrode plate and a shield ring and the uniformity of a deposition speed.

FIG. 5 shows the results of checking the uniformity of the deposition speed on the top surface of the wafer W when the step (the height of the projection 20a) between the exposed surface of the electrode plate 20 and the exposed surface of the shield ring 26 is changed. The deposition conditions here are $SiH_4/SiF_4/O_2/Ar=22/28/250/50$ (sccm), pressure (discharge pressure) of 1.3 Pa, and the electrode gap of 20 mm. The deposition speed uniformity was calculated from (deposition speed uniformity (%))=((maximum deposition speed)+ (minimum deposition speed))/(average deposition speed)× 2)×100. A lower value of the deposition speed uniformity indicates a less variation in deposition speed and high process uniformity. The thickness of the shield ring 26 is 10 mm and when the step height is 0 mm, the electrode plate 20 and the shield ring 26 form a flat surface.

As shown in FIG. 5, the smaller the step between the electrode plate 20 and the shield ring 26 is, the smaller the value of the uniformity of the deposition speed becomes, making it apparent that a film deposition process with high uniformity is performed on the entire top surface of the wafer W.

Figure 6:
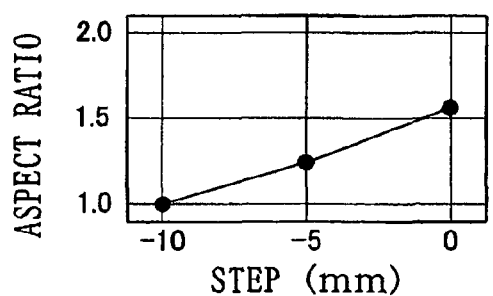
FIG. 6 shows the relationship between a step between the electrode plate and the shield ring and the aspect ratio of a groove which can be buried.
Figure 7:
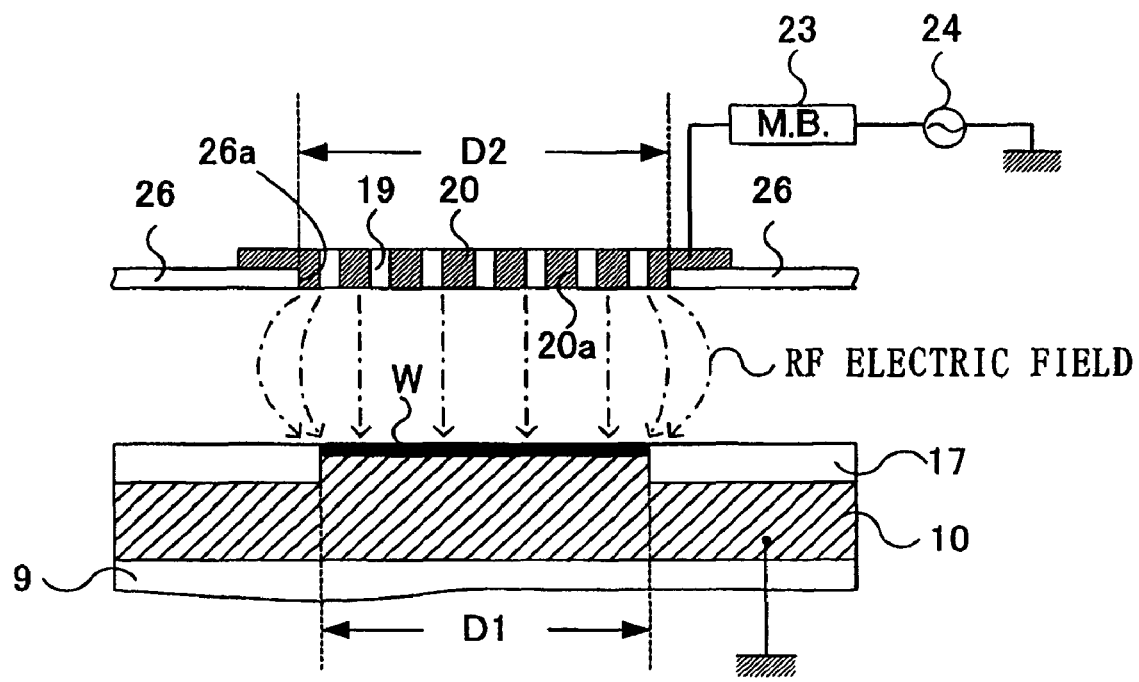
FIG. 7 is an enlarged diagram of an upper electrode and a susceptor according to a second embodiment.

FIG. 6 shows the results of performing a process of burying a groove having a predetermined aspect ratio while changing the step and checking the maximum aspect ratio at which a good burying process is possible without producing voids. In FIG. 6, the aspect ratio is expressed as a ratio with 1 being the result when the flat electrode plate 20 (a step of −10 mm) is used.

As shown in FIG. 6, the smaller the step is or without the step, the higher the maximum aspect ratio which ensure good burying becomes. In case where the electrode plate 20 and the shield ring 26 form a flat surface (a step of 0 mm), for example, a good burying process can be performed on a groove whose aspect ratio is 1.5 times that of the case where the flat electrode plate 20 is used (a step of −10 mm). Here, the higher the aspect ratio of the groove is, the easier it is to cause voids at the time of the burying process.

Together with the results shown in FIG. 4, it is understood that as the step is made smaller or eliminated by the use of the projection type electrode plate 20, process pressure above the wafer W is suppressed low and a highly reliable burying process with generation of fewer voids is carried out.

As described above, the first embodiment takes such a structure that the electrode plate 20 is formed into a projection type and the exposed surface of the electrode plate 20 and the major surface of the shield ring 26 form a flat surface. This structure eliminates the step between the electrode plate 20 and the shield ring 26, and can reduce or eliminate the disturbance of the process gas above the wafer W. Accordingly, the pressure above the wafer W becomes nearly uniform on the entire top surface so that a process with high uniformity can be performed on the entire top surface. Further, the pressure above the wafer W can be kept at a relatively low pressure so that a highly reliable process with suppressed generation of voids can be executed.

In the first embodiment, the height of the projection 20a of the electrode plate 20 is approximately equal to the thickness of the shield ring 26 and the electrode plate 20 and the shield ring 26 form substantially the same surface. However, the height of the projection 20a is not limited to that and may be greater than the thickness of the shield ring 26 so that the projection 20a protrudes from the opening of the shield ring 26.

(Second Embodiment)

The second embodiment of the invention will be discussed below. A plasma process system 1 according to the second embodiment has nearly the same structure as the plasma process system 1 of the first embodiment illustrated in FIG. 1. FIG. 6 shows an enlarged diagram of near the upper and lower electrodes of the second embodiment. In the diagram, same reference symbols are given to those portions which are the same as those in FIGS. 1 and 2 and the description will be omitted for easier understanding.

In the second embodiment, the electrode plate 20 has a structure similar to that of the first embodiment. That is, the electrode plate 20 is formed into a projection type and the exposed surface (bottom surface) of the projection 20a and the exposed surface (bottom surface) of the shield ring 26 form approximately the same plane surface. The diameter of the opening of the focus ring 17 is set approximately equal to the diameter of the wafer W.

The ratio of the diameter of the exposed surface of the susceptor 10 (lower electrode diameter D1) and the diameter of the exposed surface of the electrode plate 20 (upper electrode diameter D2) is designed to be a predetermined value. Here, the exposed surface of the susceptor 10 indicates the surface that substantially functions as the lower electrode, and the lower electrode diameter D1 is almost equal to the diameter of the opening of the focus ring 17 or the diameter of the wafer W. The exposed surface of the electrode plate 20 indicates the surface that substantially functions as the upper electrode, and the upper electrode diameter D2 is almost equal to the diameter of the major surface of the projection 20a or the diameter of the opening 26a of the shield ring 26. In is assumed below that the lower electrode diameter D1 indicates the diameter of the wafer W and the upper electrode diameter D2 indicates the diameter of the major surface of the projection 20a.

For example, the lower electrode diameter D1 and the upper electrode diameter D2 are designed in such a way that their ratio (D2/D1) is 1.2 to 1.5, particularly, 1.25 to 1.45. In case where the lower electrode diameter D1 is 200 mm, for example, the upper electrode diameter D2 is set to 260 mm.

Here, the gas holes 19 are provided so as to penetrate the projection 20a of the electrode plate 20, e.g., concentrically. The electrode diameter ratio (D2/D1) is varied in such a way as not to change the layout of the gas holes 19. As the electrode diameter ratio (D2/D1) is changed, therefore, an RF electric field which is formed between the upper and lower electrodes can be changed with the supply of the process gas set constant

EXAMPLE 2

Figure 8:
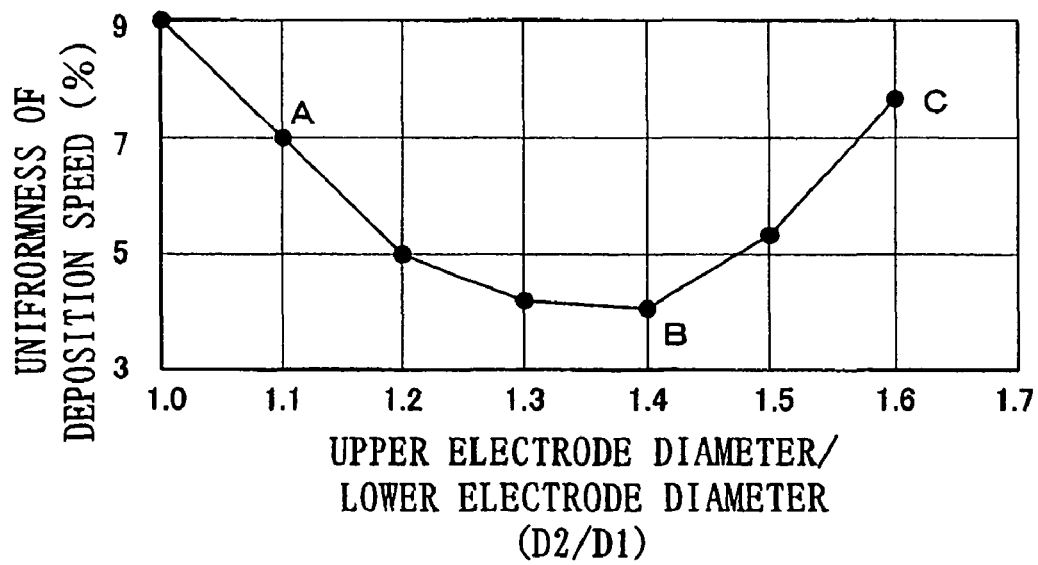
FIG. 8 shows the relationship between a ratio of upper and lower electrodes (D2/D1) and the uniformity of a deposition speed.

FIG. 8 shows the results of performing a film deposition process while changing the electrode diameter ratio (D2/D1) and checking the uniformity of the deposition speed on the top surface of the wafer W. The deposition conditions here were $SiH_4/SiF_4/O_2/Ar=22/28/250/50$ (sccm), pressure of 1.3 Pa, and the electrode gap of 20 mm. The deposition speed uniformity was calculated from (deposition speed uniformity: %)=((maximum deposition speed)+(minimum deposition speed))/(average deposition speed)×2)×100.

It is understood from the results shown in FIG. 8 that when the electrode diameter ratio (D2/D1) lies in the range of 1.2 to 1.5, the deposition speed uniformity is equal to or less than 5% and a film is formed with high uniformity on the entire top surface of the wafer W. It is also apparent that higher uniformity is shown particularly when the electrode diameter ratio is in the range of 1.25 to 1.45.

When the diameters of the upper and lower electrodes are equal (D2/D1=1) and when the diameter of the upper electrode D2 is too large (D2/D1>1.5), it is apparent that film deposition with high uniformity is not made on the entire top surface of the wafer W and the value of the deposition speed uniformity is high so that an RF electric field suitable for the process is not formed.

Figure 9:
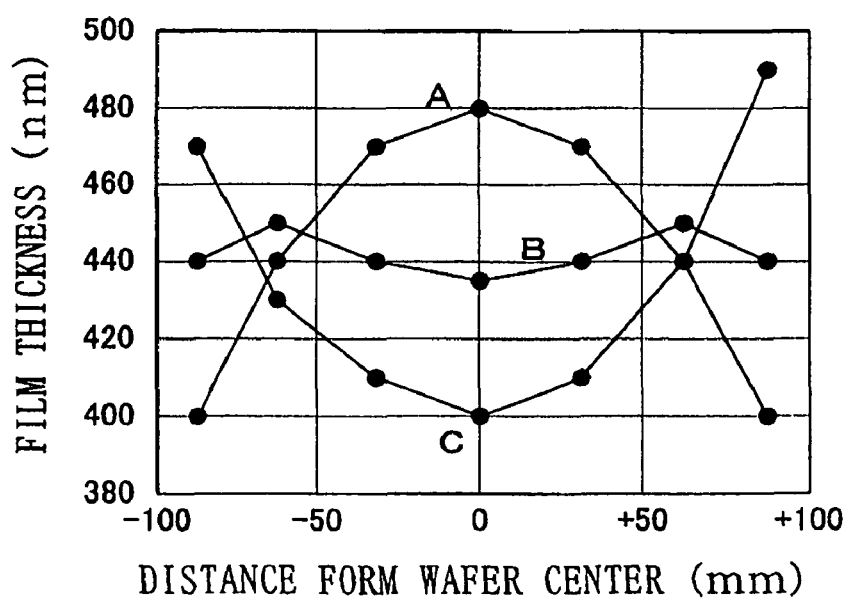
FIG. 9 shows the film thickness distribution on a wafer surface at A, B and C in FIG. 8.

FIG. 9 shows the results of checking the film thickness at individual points of the top surface of the wafer W after film deposition in cases where the electrode diameter ratio is 1.1 (A in FIG. 8), 1.4 (B) and 1.6 (C).

It is understood from FIG. 9 that when the electrode diameter ratio is 1.4 (B), deposition with high uniformity is carried out. When the ratio is 1.1 (A), on the other hand, the deposition speed is high at the center portion of the wafer W and is low at the end portion. When the ratio is 1.6 (C), contrary to the above, the deposition speed is high at the end portion and is low at the center portion. It is apparent from those like the results shown in FIG. 8 that when the electrode diameter ratio lies within the range of 1.2 to 1.5, the optimal RF electric field is formed and film deposition with high uniformity can be performed on the entire top surface of the wafer W.

In the second embodiment, the projection type electrode plate 20 is used. However, the invention is not limited to the projection type electrode plate 20 but can be adapted to the flat electrode plate 20. For instance, the ratio of the upper and lower electrode diameters may likewise be defined with the upper electrode diameter D2 set to the diameter of the exposed surface of the electrode plate 20, i.e., the diameter of the opening of the shield ring 26.

(Third Embodiment)

Figure 10:
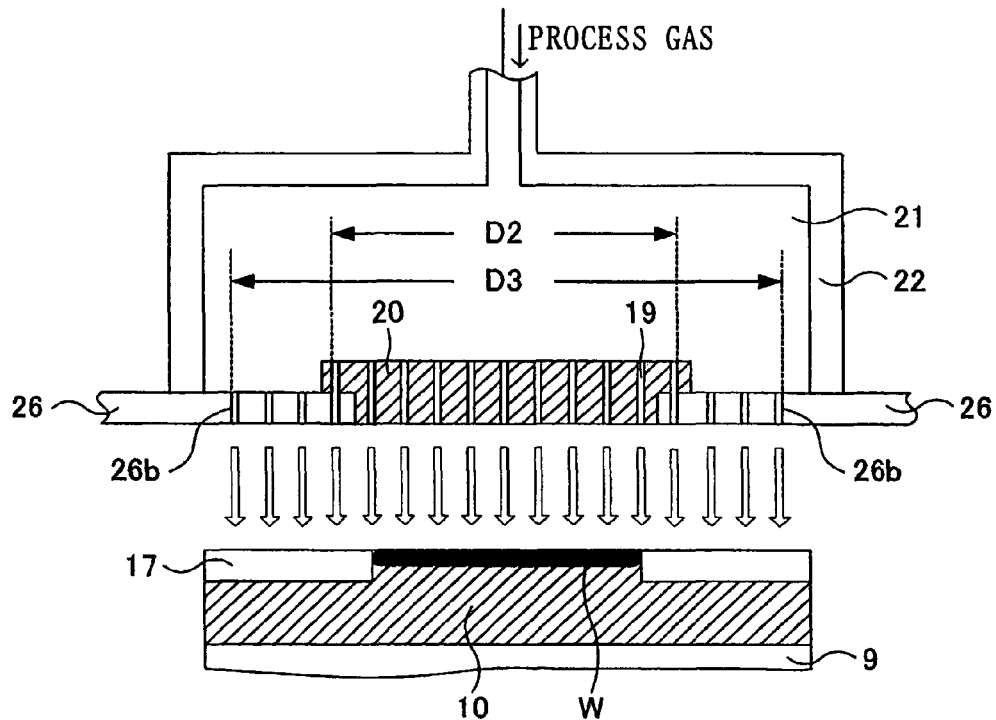
FIG. 10 is an enlarged diagram of an upper electrode and a susceptor according to a third embodiment.

The third embodiment of the invention will be discussed below. A plasma process system 1 according to the third embodiment has approximately the same structure as the plasma process system 1 of the first embodiment illustrated in FIG. 1. FIG. 10 shows an enlarged diagram of near the upper and lower electrodes of the third embodiment. In the diagram, same reference symbols are given to those portions which are the same as those in FIGS. 1 and 2 and the description will be omitted for easier understanding.

The electrode plate 20 is formed into a projection type and, as shown in FIG. 10, the exposed surface (bottom surface) of the projection 20a and the exposed surface (bottom surface) of the shield ring 26 form approximately the same plane surface. The exposed surface of the projection 20a substantially forms an RF electric field.

The third embodiment has such a structure that while the area of the exposed surface of the electrode plate 20 is kept constant, the supply area of the process gas (the blowoff diameter of the process gas) can be enlarged as desired. That is, it has a structure such that the gas holes 19 are provided not only in the electrode plate 20 but also in the shield ring 26 that surrounds it.

As shown in FIG. 10, the shield ring 26 has gas holes 26b formed around the electrode plate 20. The electrode support 22 is provided in such a way that the diffusion portion 21 formed inside communicate with the gas holes 26b. Accordingly, the process gas is ejected from the gas holes 19 provided in the electrode plate 20 and the gas holes 26b in the shield ring 26.

The gas holes 26b are arranged in the same way as the gas holes 19 of the electrode plate 20. The gas holes 19 of the electrode plate 20 are provided, for example, concentrically, and the gas holes 26b of the shield ring 26 are provided around the gas holes 19 of the electrode plate 20.

Here, the blowoff diameter (D3) for the process gas which is comprised of the gas holes 19 and the gas holes 26b is designed to be larger than the diameter of the exposed surface of the electrode plate 20 (upper electrode diameter D2) and, particularly, about 1.1 times greater (D3/D1>1.1). The blowoff diameter D3 is the diameter of, for example, the outermost gas hole 26b. When the upper electrode diameter D2 is set to 260 mm, for example, the blowoff diameter D3 is set to about 280 mm about 1.1 times D2.

As discussed above, the provision of the gas holes 26b in the shield ring 26 can enlarge the gas supply area without changing the RF electric field without changing the area of the exposed surface of the electrode plate 20. As the gas supply area is enlarged, the gas can be supplied to the entire top surface of the wafer W more uniformly. Therefore, a process with high uniformity can be performed on the top surface of the wafer W.

EXAMPLE 3

Figure 11:
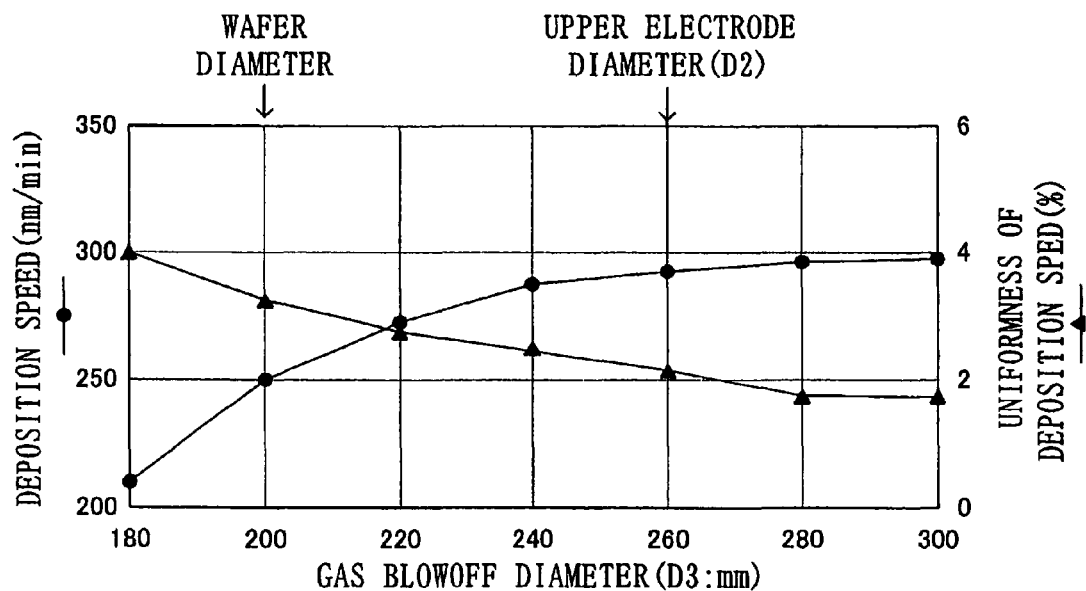
FIG. 11 shows the relationship between a gas blowoff diameter (D3) and the deposition speed.

FIG. 11 shows the results of checking the deposition speed and the uniformity of the deposition speed on the top surface of the wafer W while changing the blowoff diameter D3 for the process gas. Here, the upper electrode diameter D2 was set to 260 mm. The deposition conditions were $SiH_4/SiFO_2/Ar=22/28/250/50$ (sccm), pressure of 1.3 Pa, and the electrode gap of 20 mm. The deposition speed uniformity was calculated from (deposition speed uniformity: %)=((maximum deposition speed)+(minimum deposition speed))/(average deposition speed)×2)×100.

It is apparent from FIG. 11 that the greater the blowoff diameter D3 is, the higher the deposition speed is. It is also apparent that when the blowoff diameter D3 is equal to or greater than about 240 mm (equal to or greater than about 0.85 times the upper electrode diameter D2 and equal to or greater than about 1.2 times the wafer diameter), a sufficient high deposition speed is obtained.

Further, it is apparent from that the greater the blowoff diameter D3 is, the higher the uniformity of the deposition speed is. It is also apparent that when the blowoff diameter D3 is greater than the upper electrode diameter D2, particularly, equal to or greater than 280 mm (equal to or greater than about 1.1 times the upper electrode diameter D2 and equal to or greater than about 1.4 times the wafer diameter), the uniformity of the deposition speed shows a stable high value.

From those, if the blowoff diameter D3 is larger than the upper electrode diameter D2, particularly, equal to or greater than about 1.1 times, a process with high uniformity can be performed on the entire top surface of the wafer W at a high deposition speed.

According to the third embodiment, as described above, the gas holes 26b are provided in the shield ring 26. Accordingly, the blowoff diameter D3 for the process gas can be enlarged without changing the RF electric field by changing the area of the exposed surface of the electrode plate 20 that functions as the upper electrode. This can lead to an improvement on the deposition speed and an improvement on the in-plane process uniformity.

In the third embodiment, the gas holes 26b provided in the shield ring 26 communicate with the hollow portion in the electrode support 22 and receive the same supply of the process gas as the gas holes 19 of the electrode plate 20 do. But, an independent gas flow passage connected to the gas holes 26b of the shield ring 26 may be provided. At this time, a flow rate control device or the like may be provided in the gas flow passage for the shield ring 26 to provide the structure that adjusts the amounts of the gas supply at the electrode plate 20 and the shield ring 26 respectively.

In the third embodiment, the projection type electrode plate 20 is used. However, the projection type electrode plate 20 is not restrictive but a similar structure may be taken for the flat electrode plate 20. In this case, the diameter of the exposed surface of the electrode plate 20 or the inside diameter of the opening of the shield ring 26 should be set to the upper electrode diameter (D2) and the blowoff diameter (D3) should be determined based on it.

(Fourth Embodiment)

A plasma process system 1 according to the fourth embodiment of the invention will be discussed below referring to the accompanying drawings. The plasma process system 1 according to the fourth embodiment has a structure such that a fluorine-based cleaning gas is used to dry-clean the interior.

Figure 12:
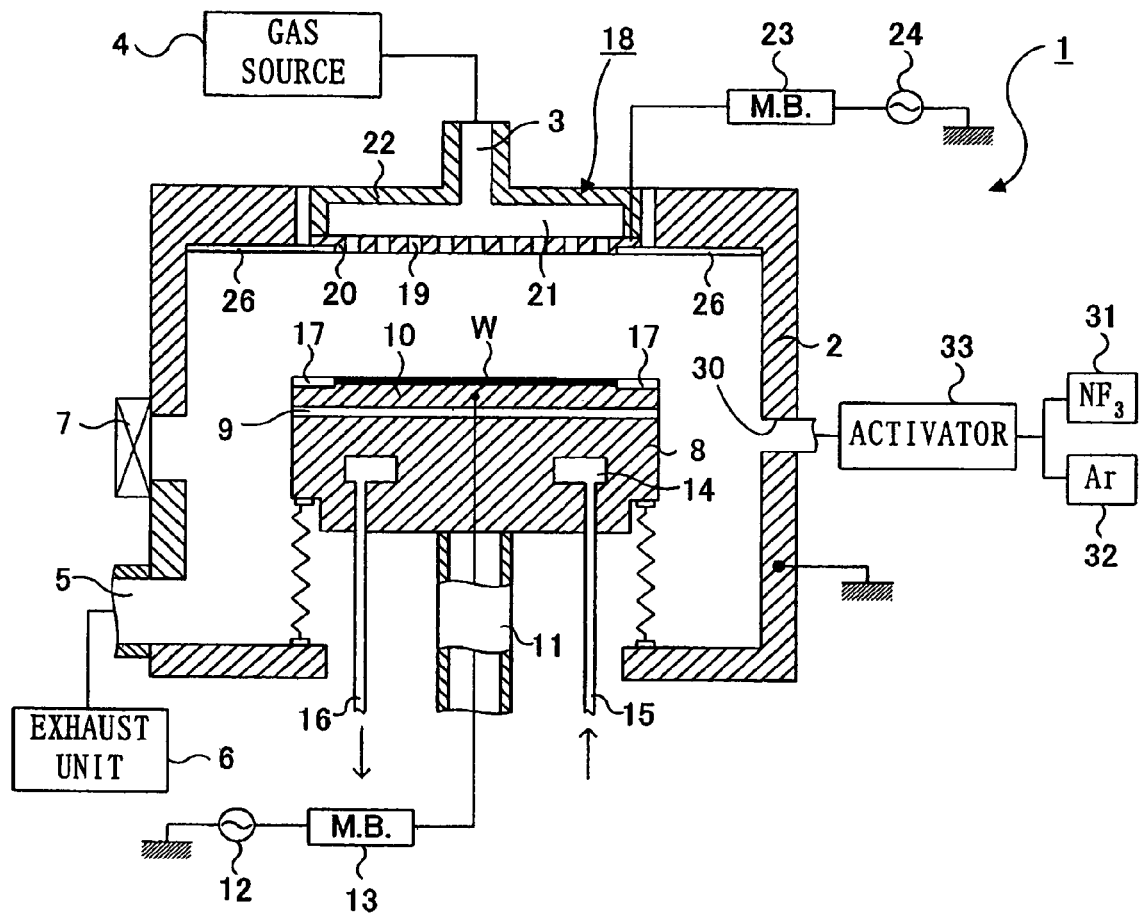
FIG. 12 illustrates the structure of a plasma process system according to a fourth embodiment.

The structure of the plasma process system 1 according to the fourth embodiment is illustrated in FIG. 12. In FIG. 12, same reference symbols are given to the same structure to omit the description.

As shown in FIG. 12, a cleaning gas supply port 30 is formed in one side wall of the chamber 2. The cleaning gas supply port 30 is connected to a cleaning gas supply source 31 and a carrier gas source 32. A fluorine-based cleaning gas, e.g., nitrogen trifluoride ($NF_3$), is supplied from the cleaning gas supply source 31. An inactive gas, such as argon (Ar) or nitrogen, is supplied from the carrier gas source 32.

An activator 33 is provided between the cleaning gas supply port 30 and the cleaning gas supply source 31 and carrier gas source 32. The activator 33 has an unillustrated plasma generation mechanism and generates a high-density plasma of the gas that passes inside, such as an ECR (Electron Cyclotron Resonance) plasma or inductive coupled plasma (Inductive Coupled Plasma: ICP). The activator 33 selectively discharges fluorine radicals in the plasma.

As the cleaning gas is supplied into chamber 2, a contaminated material, such as silicon-based material adhered or deposited the interior of the chamber 2 is decomposed by the fluorine radicals and discharged and eliminated. In this manner, the cleaning gas is turned into a plasma outside the chamber 2 and so-called remote plasma cleaning is carried out.

In the fourth embodiment, the electrode plate 20 is made of a material having a resistance to fluorine radicals rather than silicon. That is, the electrode plate 20 is made of anodized aluminum, silicon carbide, carbon, aluminum, alumina, sprayed quartz alumina or the like. As the electrode plate 20 is made of the material, it is possible to suppress the degrading of the electrode plate 20 originated from cleaning using a fluorine gas. This suppresses a reduction in the deposition uniformity which is caused by the degrading of the electrode plate 20 and a reduction in productivity which is caused by an increase in the frequency of replacement of the electrode plate 20.

A description will now be given of the deposition process of the plasma process system 1 and the operation at the time of cleaning with reference to FIG. 12.

First, the wafer W is loaded into the chamber 2 and mounted on the susceptor 10. Next, the process gas consisting of SiF$_4$, SiH$_4$, O$_2$ and Ar is supplied into the chamber 2 and RF power is applied to generate the plasma of the process gas. An SiOF film is deposited on the wafer W by the generated plasma. As a film with a predetermined thickness is deposited on the wafer W, the wafer W is removed from the chamber 2. The above-described operation is repeated to continuously process wafers W. At this time, every time a predetermined number of wafers W are processed, the chamber 2 is cleaned.

At the time of cleaning, first, a dummy wafer is loaded into the chamber 2 and mounted on the susceptor 10. Then, the supply of NF$_3$ and Ar is started and the activator 33 is activated. The activator 33 generates the plasma of the process gas and supplies a gas containing fluorine radicals as an essential component into the chamber 2. For example, SiOF adhered to the interior of the chamber 2 is caused by the cleaning gas to react with the fluorine radicals to be decomposed into silane tetrafluoride and is removed. Cleaning proceeds as deposition or the like inside the chamber 2 is removed this way.

When predetermined end conditions, such as time and degree of cleaning, are reached thereafter, the activator 33 is set off to stop the supply of the gas. This ends cleaning and film deposition is started again.

EXAMPLE 4

Figure 13:
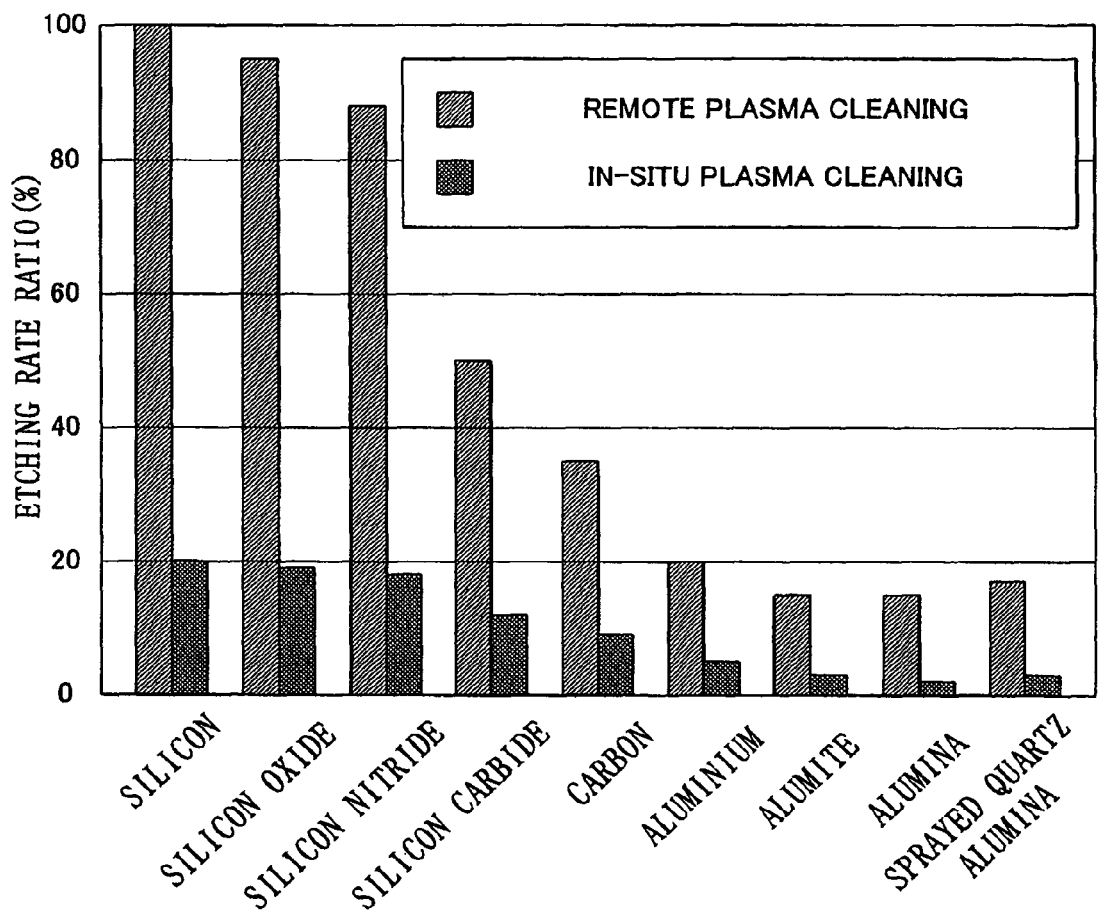
FIG. 13 shows the results of checking the etching rates of electrode plates made of various kinds of materials.

The etching rates of the electrode plates 20 when the above-described cleaning was carried out using the electrode plates 20 made of various kinds of materials. The materials used were silicon, silicon oxide, silicon nitride, anodized aluminum, silicon carbide, carbon, aluminum, alumina, sprayed quartz alumina. The results are shown in FIG. 13. The results were shown as a ratio with the etching rate of silicon taken as 100. The cleaning conditions are NF$_3$/Ar=1500 sccm/1500 sccm, pressure of 300 Pa, an electrode gap of 48 mm and plasma supply power of about 2 kW.

It is apparent from FIG. 13 that the etching rates of anodized aluminum, silicon carbide, carbon, aluminum, alumina and sprayed quartz alumina are lower than the etching rates of silicon, silicon oxide and silicon nitride. Particularly, they are half the etching rate of silicon or lower (50% or lower). This indicates that the electrode plates 20 made of anodized aluminum, silicon carbide, carbon, aluminum, alumina and sprayed quartz alumina are not easily etched by a fluorine-based gas are not easily corroded.

FIG. 13 shows the results of not a case of remote plasma cleaning but also a case where in-situ (in situ) plasma cleaning was carried out. In the in situ plasma cleaning, NF$_3$ and Ar are introduced into the chamber 2 and the plasma of the cleaning gas is generated inside the chamber 2. The cleaning conditions are NF$_3$/Ar=100 sccm/0 sccm, pressure of 65 Pa, an electrode gap of 48 mm and plasma supply power of about 500 W.

As shown in FIG. 13, a tendency similar to that in the remote plasma cleaning is seen in the in-situ plasma cleaning too. That is, the etching rate ratios in the case of using the electrode plates 20 made of silicon, silicon oxide and silicon nitride are close to 20%, whereas the etching rate ratios in the case of using the electrode plates 20 made of anodized aluminum, silicon carbide, carbon, aluminum, alumina and sprayed quartz alumina are about 10% or less. Apparently, the electrode plate 20 made of a plasma-resistive material such as silicon carbide is less likely to be degraded by the remote plasma cleaning and in-situ plasma cleaning than the electrode plate 20 made of silicon or the like.

Figure 14:
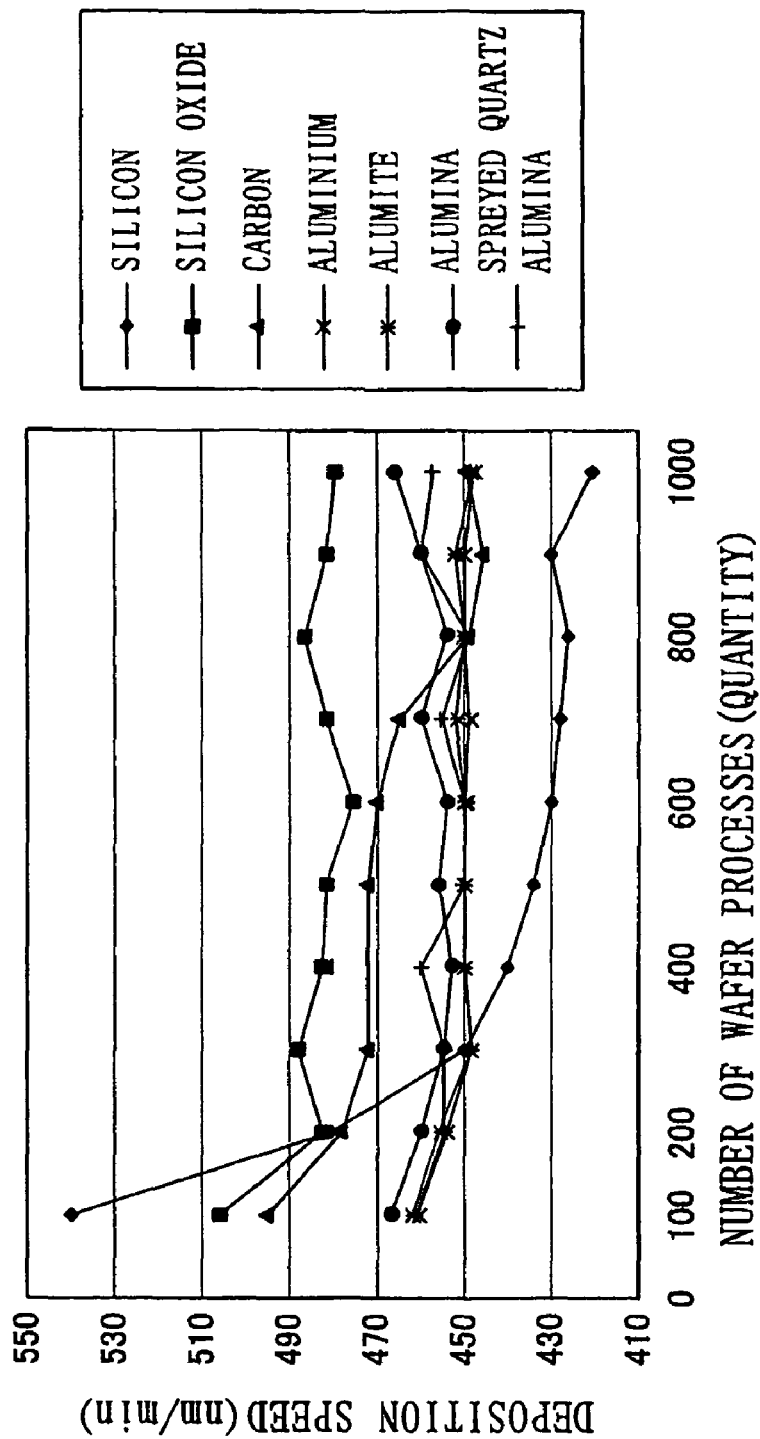
FIG. 14 shows the results of checking the deposition speeds when continuous deposition was performed using electrode plates made of various kinds of materials.

FIG. 14 shows the results of continuously performing film deposition with cleaning in between using the electrode plates 20 made of various kinds of materials and checking the deposition speeds in the individual film deposition processes. The electrode plate 20 was made of one of alumite, silicon carbide, carbon, aluminum, alumina, sprayed quartz alumina and silicon. Film deposition was performed in such a way that a film with a predetermined thickness was formed on the wafer W and the deposition speed was calculated from the time needed to process 100 wafers W. Cleaning was performed every time 25 wafers W were processed.

As apparent from FIG. 14, in case of using the electrode plate 20 of silicon, the deposition speed is very high at the beginning of the process as compared with the other materials. But, the deposition speed drops significantly later and becomes lower than that for the other materials.

In case of using a material other than silicon, on the other hand, the deposition speed does not drop significantly and is relatively constant even after 1000 wafers W are processed. In case of using the electrode plate 20 of silicon carbide, particularly, the highest deposition speed is maintained. It is understood from this that the electrode plates 20 made of alumite, silicon carbide, carbon, aluminum, alumina and sprayed quartz alumina, the electrode plate 20 of silicon carbide in particular, are not easily degraded by dry cleaning. Apparently, the electrode plate 20 made of a material having a resistance to a plasma, such as silicon carbide, is not easily etched by the fluorine-contained cleaning gas and realizes a high productivity, such as a lower frequency of replacement of the electrode plate 20. As it is not easily etched at this time, the shape of the electrode plate 20 is maintained at the initial shape over a long period of time and a process with high uniformity is carried out over a long period of time.

In the fourth embodiment, the electrode plate 20 was made of a material having a resistance to fluorine radicals. However, it is not limited to the electrode plate 20 but a member around the electrode which is exposed to fluorine radicals at the time of cleaning may be made of the aforementioned material. For example, the focus ring 17 may be made of the aforementioned material. As the member around the electrode is made of a plasma-resistive material, a high productivity can be achieved while suppressing the degrading of the member.

In the fourth embodiment, a fluorine-based gas, particularly, NF$_3$, is used as a cleaning seed. However, other halogen gases, such as chloride-based gas, may be used. Further, besides NF$_3$, fluorine-based gas, such as F$_2$, CF$_4$, C$_2$F$_6$ and SF$_6$ can be used as the cleaning gas to be used for an Si-based film seed.

A cleaning gas which has an oxygen-contained material, such as O$_2$, O$_3$, CO, CO$_2$ or N$_2$O, is added to the aforementioned gas. This is particularly is effective when silicon carbide (SiC) is used as the material for the electrode plate 20. That is, a material containing carbon (C) is adhered to the inside of the chamber 2 by etching of the electrode plate 20. In general, a carbon-contained material is not easily etched by a halogen-based gas and is easily decomposed into CO$_2$ or the like by the gas of an oxygen-contained material.

Figure 15:
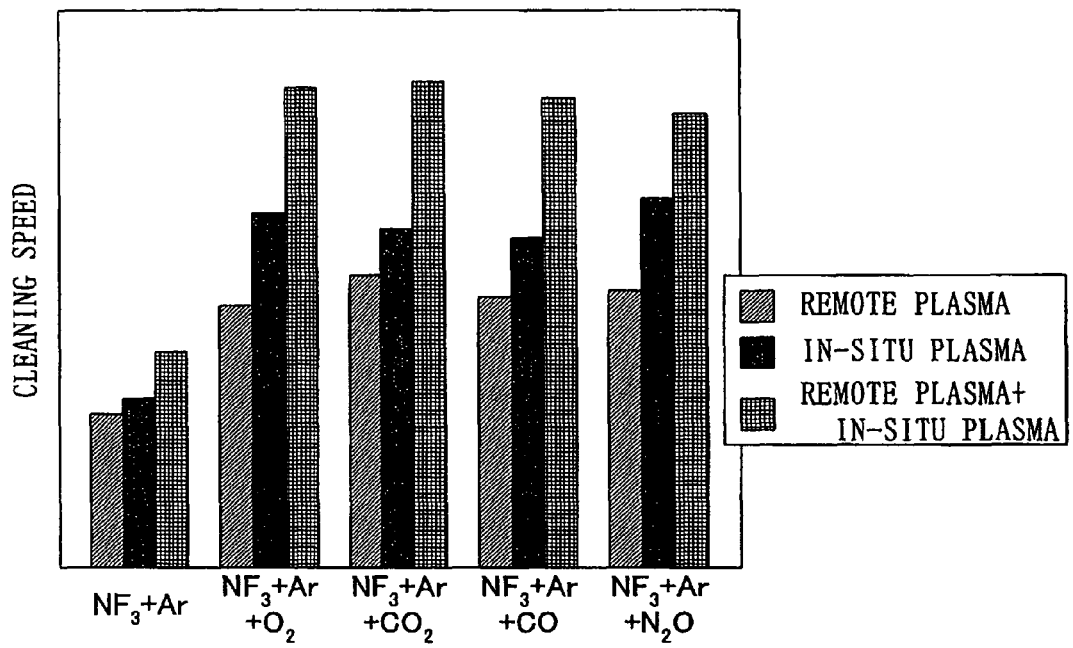
FIG. 15 shows the results of performing cleaning using an oxygen-added cleaning gas.

The results of checking the cleaning speed when cleaning was carried out with an oxygen-contained material added to a cleaning gas containing NF$_3$ and Ar are shown in FIG. 15. FIG. 15 shows the results in a case where the interior of the process system which would deposit an SiC film was cleaned with cleaning gases added with O$_2$, CO, CO$_2$ and N$_2$O. Cleaning was conducted by an in-situ plasma and a combination of the remote plasma and in-situ plasma in addition to a remote plasma. The combination of the remote plasma and in-situ plasma is to turn the cleaning gas into a plasma outside the chamber 2 and then turn it again into a plasma in the chamber 2 to do cleaning.

Figure 16:
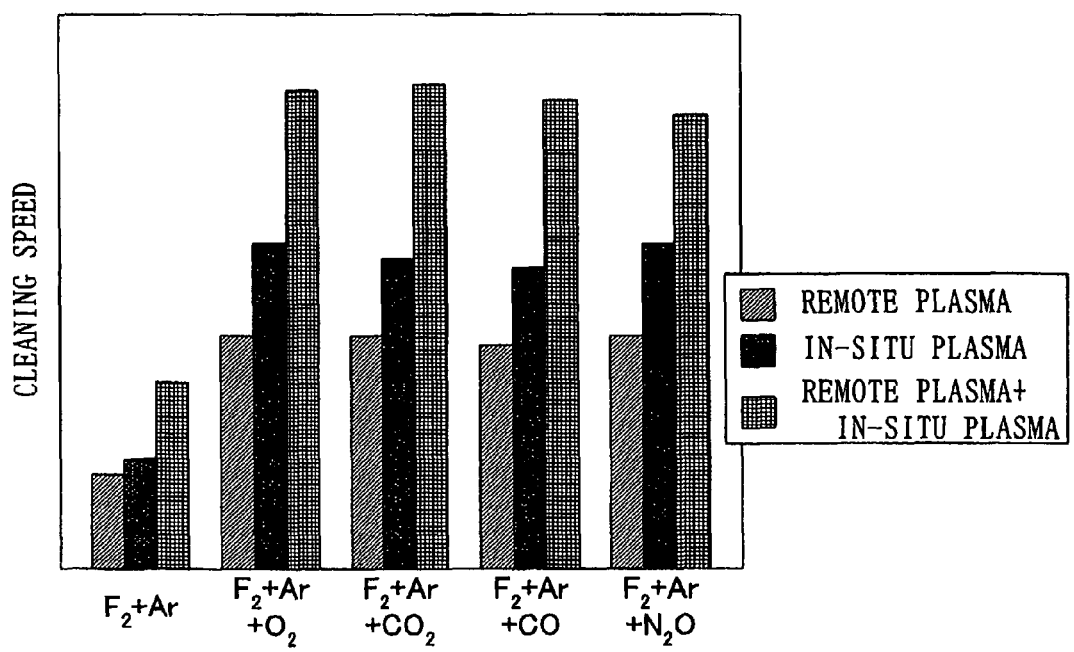
FIG. 16 shows the results of performing cleaning using an oxygen-added cleaning gas.
Figure 17:
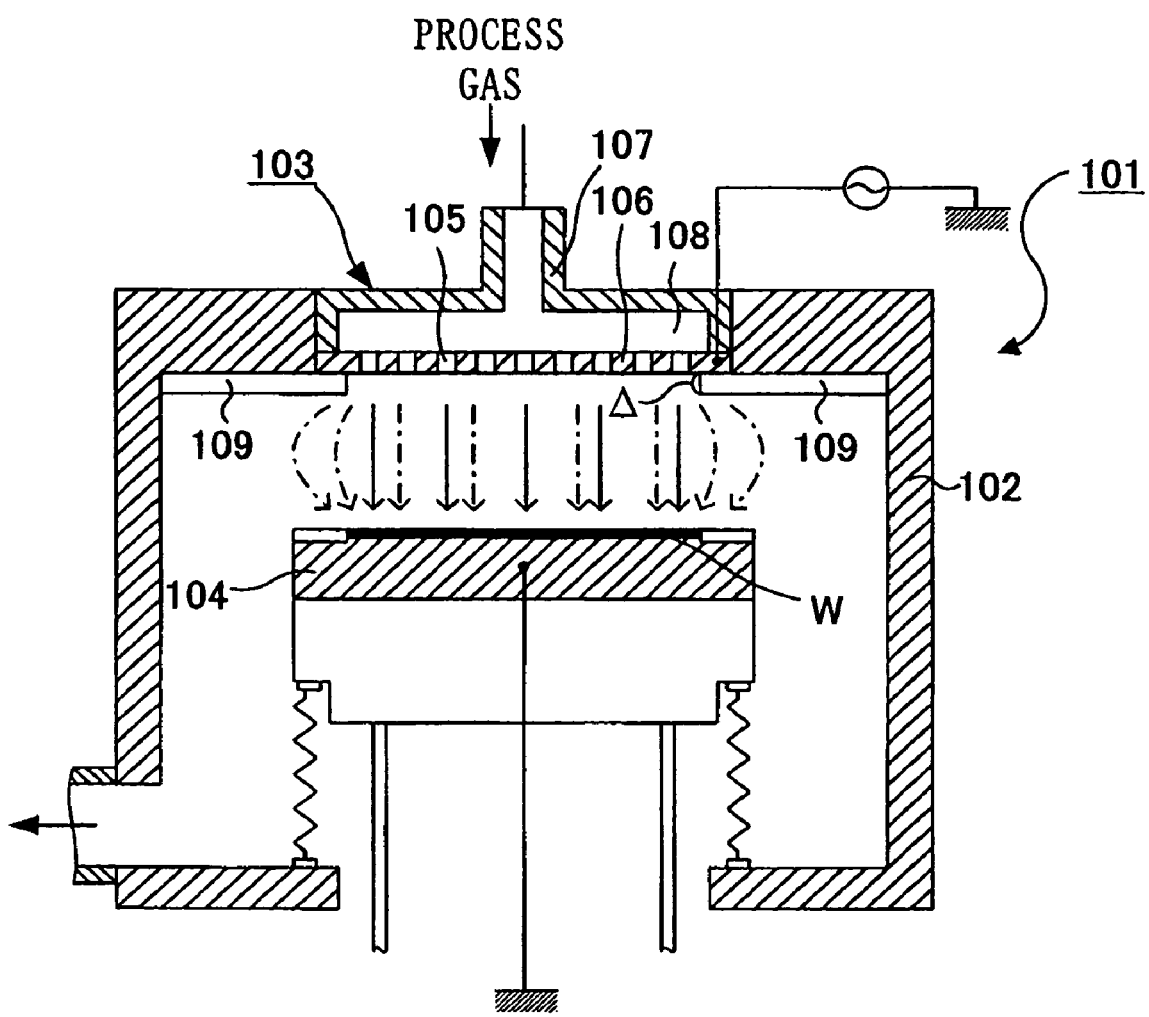
FIG. 17 illustrates the structure of a conventional plasma process system.

The results in a case where an oxygen-contained material was added to the cleaning gas containing $F_2$ and Ar are likewise shown in FIG. 16.

The cleaning conditions for a remote plasma are $NF_3/O_2/Ar$=1500 sccm/500 sccm/1500 sccm, pressure of 300 Pa, an electrode gap of 48 mm and plasma supply power of about 2 kW. The cleaning conditions for a in-situ plasma are $NF_3/O_2/Ar$=100 sccm/50 sccm/0 sccm, pressure of 65 Pa, an electrode gap of 48 mm and upper electrode supply power of 500 W. Further, the cleaning conditions for a remote plasma+in-situ plasma are $NF_3/O_2/Ar$=1000 sccm/500 sccm/1500 sccm, pressure of 300 Pa, an electrode gap of 48 mm, plasma supply power of about 2 kW and upper electrode supply power of 500 W.

It is apparent from FIGS. 15 and 16 that a higher cleaning speed can be acquired in the case of using a cleaning gas added with an oxygen-contained material than the case of making no addition. This is because a deposition containing carbon (C) which is not easily removed by fluorine radicals is easily removed as CO or the like by oxygen radicals which are generated from an oxygen-contained material. As adding an oxygen-contained material to the cleaning gas can enhance the cleaning speed.

In the first to fourth embodiments, a case where the parallel plate plasma process system 1 deposits an SiOF film on a wafer has been discussed as one example. The film seed is not limited to those in the above-described example but may be another silicon-based film, such as, $SiO_2$, SiN, SiCN, SiCH or SiOCH. Various kinds of gas seeds can be used by combining the film seeds.

Further, the invention is not limited to a deposition system but can be adapted to any plasma process system which performs dry cleaning, such as an etching system or thermal process system. For example, it can be used not only in a CVD process but also various plasma processes, such as an etching process. Further, a plasma generating method is not only a parallel plate type but also may be any type, such as a magnetron type, inductive coupled plasma or ECR (Electron Cyclotron Resonance) type. Furthermore, a to-be-processed subject is not limited to a semiconductor wafer but may be a glass substrate or the like for a liquid crystal display device.

INDUSTRIAL APPLICABILITY

The invention can be suitably used for fabrication of electronic devices, such as a liquid crystal display device.

The invention is based on Japanese Patent Application No. 2001-13572 filed on Jan. 22, 2001, Japanese Patent Application No. 2001-13574 filed on Jan. 22, 2001 and Japanese Patent Application No. 2001-239720 filed on Aug. 7, 2001, and includes the specifications, claims, drawings and abstracts thereof. The present specification incorporates what is disclosed in the applications entirely by reference.

What is claimed:

1. A plasma process system comprising:
   a chamber;
   an electrode plate having a projection in a center portion and being connected to a high-frequency power supply and provided with first gas holes for supplying a process gas into said chamber;
   a shield ring which is provided with second gas holes, having an opening formed to cover a periphery of said projection at a lower portion of said projection in the center portion of said electrode plate and placed in such a way that said projection of said electrode plate is fitted in said opening and exposed to the inside of said opening, wherein said electrode plate exposed to the inside of said opening comprises an exposed surface, said exposed surface is a major surface and forms a substantially flat surface together with said shield ring; and
   a hollow diffusion portion defined by surfaces of the electrode plate and shield ring, such that the same gas is supplied from the hollow diffusion portion to the first and second gas holes,
   wherein a blowoff diameter is delimited by a combination of the first gas holes and the second gas holes and a ratio of the blowoff diameter to a diameter of the exposed surface is equal to or greater than 1.1 and said shield ring is formed of an insulating material.

2. The plasma process system according to claim 1, wherein said second gas holes are laid out concentrically around said opening and the ratio of the blowoff diameter to the diameter of the exposed surface is about 1.1.

3. The plasma process system according to claim 1, wherein the shield ring comprises ceramic.

4. The plasma process system according to claim 1, wherein the shield ring comprises aluminum nitride.

5. The plasma process system according to claim 1, wherein the shield ring prevents abnormal discharge at the periphery of the electrode plate when generating plasma.

6. The plasma process system according to claim 1, wherein the second gas holes supply the process gas into the chamber and further wherein the process gas supplied from the second gas holes is the same as the process gas supplied from the first gas holes.

7. The plasma process system according to claim 1, wherein the hollow diffusion portion is formed inside an electrode support.

8. The plasma process system according to claim 7, wherein the shield ring is fastened to the electrode support.

9. The plasma process system according to claim 1, further comprising
   a second electrode plate on one surface of which a to-be-processed subject is placed, the one surface being disposed so as to be opposed to said electrode plate, wherein
   said electrode plate comprises an opposing surface with a diameter that is 1.2 to 1.5 times as large as a diameter of said one surface.

10. A plasma process method, comprising:
    providing a plasma process system having:
      a chamber in which a predetermined plasma process is performed on a subject to be processed by generation of a plasma inside,
      an electrode plate having a projection in a center portion and being provided with first gas holes for supplying a process gas into said chamber and connected to a high-frequency power supply, and
      a shield ring which is provided with second gas holes, having an opening formed to cover a periphery of said projection at a lower portion of said projection in the center portion of said electrode plate and placed in such a way that said projection of said electrode plate is fitted in said opening and exposed to the inside of said opening, wherein said electrode plate exposed to the inside of said opening comprises an exposed surface and forms a substantially flat surface together with said shield ring,
    wherein a blowoff diameter is delimited by a combination of the first gas holes and the second gas holes and a ratio of the blowoff diameter to a diameter of the exposed surface is equal to or greater than 1.1 and said shield ring is formed of an insulating material; and spraying said process gas into said chamber through said first gas holes and said second gas holes.

11. The plasma process method according to claim 10, wherein the shield ring comprises ceramic.

12. The plasma process method according to claim 10, wherein the shield ring comprises aluminum nitride.

13. The plasma process method according to claim 10, wherein the shield ring prevents abnormal discharge at the periphery of the electrode plate when generating plasma.

14. The plasma process method according to claim 10, wherein the plasma process system further comprises a diffusion portion from which the gas is sprayed into the chamber through the first gas holes and the second gas holes, wherein the diffusion portion communicates with the first gas holes and the second gas holes.

15. The plasma process method according to claim 14, wherein the diffusion portion is formed inside an electrode support.

16. The plasma process method according to claim 15, wherein the shield ring is fastened to the electrode support.

17. The plasma process method according to claim 15, wherein the diffusion portion is further defined by surfaces of the electrode plate and shield ring.

18. The plasma process method according to claim 10, wherein
said plasma process system further comprises a second electrode plate on one surface of which a to-be-processed subject is placed, the one surface being disposed so as to be opposed to said electrode plate,
a diameter of said electrode plate is 1.2 to 1.5 times as large as a diameter of said one surface, and
the plasma process method further includes supplying high-frequency power to said electrode plate.

* * * * *